United States Patent [19]
Chobot et al.

[11] Patent Number: 5,713,127
[45] Date of Patent: Feb. 3, 1998

[54] NON-ANNULAR LANDS

[75] Inventors: Ivan Ivor Chobot, Whitby, Canada; Robert Anthony Martone, Endicott; Thurston Bryce Youngs, Jr., Vestal, both of N.Y.

[73] Assignee: International Business Machines Corporation, Armonk, N.Y.

[21] Appl. No.: 488,259

[22] Filed: Jun. 7, 1995

Related U.S. Application Data

[62] Division of Ser. No. 340,508, Nov. 16, 1994, Pat. No. 5,539,156.

[51] Int. Cl.$^6$ ................................................. H05K 3/10
[52] U.S. Cl. ................................. 29/852; 174/262
[58] Field of Search .................... 29/852; 427/97; 174/262

[56] References Cited

U.S. PATENT DOCUMENTS

| | | |
|---|---|---|
| 3,436,819 | 4/1969 | Lumine . |
| 4,170,819 | 10/1979 | Peter et al. . |
| 4,318,954 | 3/1982 | Jensen . |
| 4,610,756 | 9/1986 | Strobel ............... 427/97 X |
| 4,638,116 | 1/1987 | Gumb .................. 174/262 |
| 4,661,654 | 4/1987 | Strobel ............... 427/97 X |
| 4,893,216 | 1/1990 | Hagner . |
| 5,083,188 | 1/1992 | Yamagata . |
| 5,098,533 | 3/1992 | Duke et al. . |
| 5,117,277 | 5/1992 | Yuyama et al. . |
| 5,126,819 | 6/1992 | Abe et al. . |
| 5,200,579 | 4/1993 | Takeuchi . |

FOREIGN PATENT DOCUMENTS

| | | | |
|---|---|---|---|
| 4-37191 | 2/1992 | Japan ................................. 427/97 |
| 2242384 | 10/1991 | United Kingdom ............ 228/180 |

OTHER PUBLICATIONS

IBM Tech Disclosure vol. 13 No. 1 Jun. 1970, pp. 155–155a by L. F. Miller et al.
IBM Tech Disclosure vol. 15 No. 1 Jun. 1972 p. 319 by J. R. Canizzaro et al.
Semiconductor Lithography Principles, Practices, and Materials by Wayne M. Moreau, 1988 Plenum Press, New York, pp. 7–10 and 27.

*Primary Examiner*—Carl J. Arbes
*Attorney, Agent, or Firm*—Calfee, Halter & Griswold LLP

[57] ABSTRACT

The present invention increases real estate by providing non-annular lands which do not completely encircle the through holes. The non-annular lands are non-annular, that is they do not extend 360° around the through hole. Preferably the non-annular lands contact no more than one side of the through holes thereby providing real estate not otherwise available using conventional lands. The present invention also relates to a method for producing such Non-annular lands.

7 Claims, 4 Drawing Sheets

NON-ANNULAR LANDS

This is a divisional of application Ser. No. 08/340,508 filed on Nov. 16, 1994, now U.S. Pat. No. 5,539,156.

BACKGROUND OF THE INVENTION

Early circuit board fabrication techniques involved connecting wires on the surface of the circuit board directly to through holes. Through holes, when plated with a conductive material, serve to connect the front and back surfaces of the circuit board. Unfortunately connecting wires directly to the through holes produced connections that had a high failure rate. The difference between the thermal expansion of the metal wire and the substrate lead to cracking, particularly at the juncture of the wire and the through hole. As a result, the electrical connection between the wire and the through hole was broken.

To overcome the failure rate of the connections, a land was created to connect the wire to a through hole. The land which is made of electrically conductive material, typically copper, is a circular or more specifically annular structure, that completely encircled the through hole. By providing lands the surface area of the connection between the through hole and the wire was significantly increased; this resulted in fewer failed connections.

Lands have been historically annular, to maximize the contact area between the edge of the plated through holes and the land. In addition, lands were circular in configuration to compensate for errors in drilling or photolithography that caused the lands to be offset from the through hole during the printed circuit board fabrication process.

In the quest for miniaturization of circuit boards and integrated circuit devices, designers have sought to place more and more electronic structures on the surface of circuit boards and devices. To accomplish this goal, designers require an ever increasing amount of space, that is "real estate," on the surface of a circuit board. In an attempt to increase the available "real estate", the diameter of conventional lands relative to the diameter of through holes was decreased. However, when the through holes were drilled, the drill bit often stripped the lands from the substrate, leaving an irregularity in the through hole which creates an unreliable plated through hole.

Indeed, as circuit board technology has developed, the land size has increased rather than decreased. Projections known as "flares" have been added to lands along the axis of the wire to further improve the reliability of the connection between the wire and the land. The addition of the flares to circular lands consumes even more real estate than the conventional lands.

It would be desirable to increase the available real estate on a substrate while preserving reliable connections between wires and through holes afforded by lands.

SUMMARY OF THE INVENTION

The present invention increases real estate by providing non-annular lands which do not completely encircle the through holes;, that is they do not extend 360° around the through hole. Preferably the non-annular lands contact no more than one side of the through holes thereby providing real estate not otherwise available using conventional lands. The present invention also relates to a method for producing such non-annular lands.

DETAILED DESCRIPTION OF THE INVENTION

Figure 1:
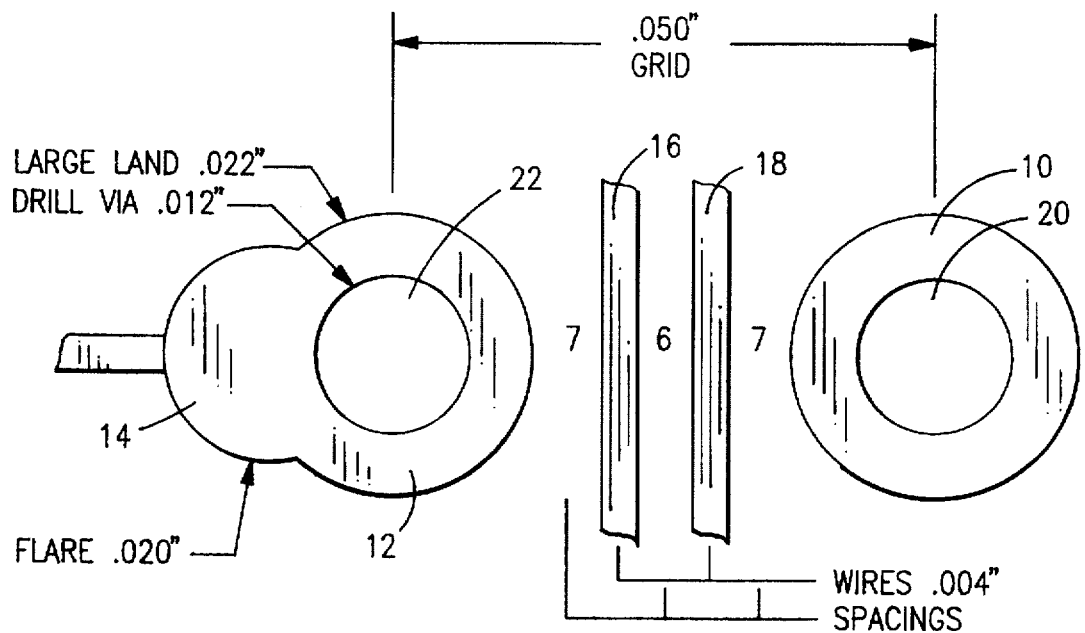
FIG. 1 is a schematic diagram of a portion of a circuit board showing land configurations and wiring between holes of typical prior art configuration.

The present invention increases real estate by providing a new land shape while preserving reliable connections between through holes and wires. Instead of a 360° annular land which contacts the entire circumference of the plated through hole, the non-annular lands of the present invention contact only a portion, that is, less than 360° of the through holes. An non-annular land is positioned on the same side of the through hole as the wire that contacts the through hole and is preferably oval in shape.

By employing the non-annular land increased real estate is obtained. For example, referring to FIG. 1, the conventional 360° annular lands 10 and the conventional 360° annular lands 12 with flares 14 can be seen connected to through holes 20 and 22. Where the through hole centers are spaced 0.05 inches apart, only two 0.004 inch wires 16 and 18 can be accommodated in the space between through holes 20 and 22.

Figure 2:
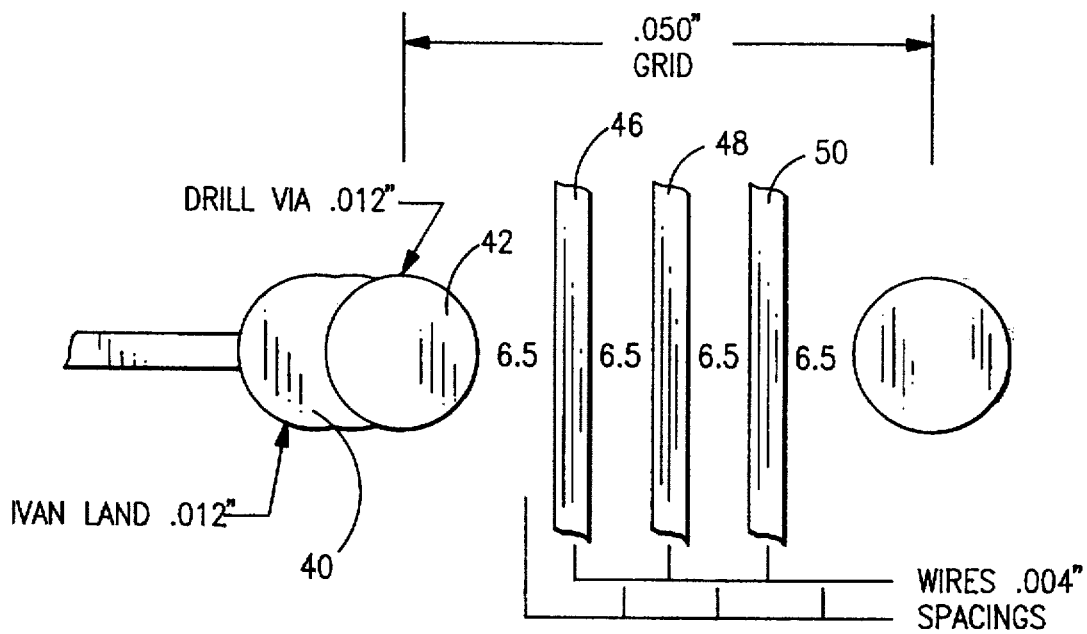
FIG. 2 is a schematic diagram similar to FIG. 1, showing the non-annular land of the present invention and wiring between holes.

With reference to FIG. 2, non-annular land 40 can be seen partially surrounding through hole 42. In the 0.05 inch space between the centers of through holes 42 and three 0.004 inch wires, wires 46, 48 and 50 may be accommodated. When epoxy-glass is the dielectric material used for the card, the minimum space between the wires, necessary to prevent shorts between the wires, is 2 mil. Thus the Non-annular lands provide a significant increase in real estate when compared to real estate available when using conventional lands.

Figure 3:
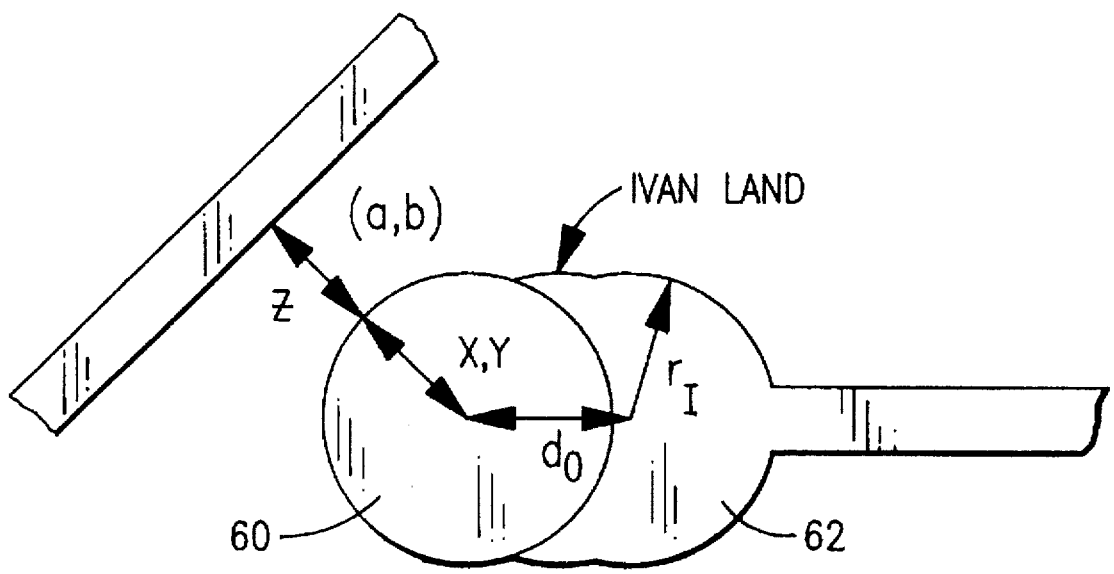
FIG. 3 is a diagram showing the relationship of an non-annular land to a plated through hole.

Referring now to FIG. 3, the preferred length of the non-annular land is preferably determined by calculating the offset distance $d_o$. The offset distance $d_o$ represents the distance that the reticules, that is the preferred artwork, are offset from the center of the through hole during the photolithographic process.

The preferred offset distance $d_o$ is determined by the following formula:

$$d_o = z + (r_h - r_l) + t_o - s$$

wherein:

$t_o$ is the tolerance of conductor generation process, that is the etching process (and $t_o$ equals 0 where the tolerance is unknown);

s is the minimum spacing of conductor lines, also referred to herein as wires, which varies depending on the circuit board design;

z, is the minimum desired space between the nearest adjacent wire and the edge of the through hole 60;

$r_h$ is the radius of through hole 60 as drilled;

$r_l$ is the radius of the reticule used to form the non-annular land 62, preferably $r_l$ is the same as $r_H$.

For example, in a system where: z is 6.5 $r_h$ is 6 mil, s is desired to be a minimum of 2 mil, the $t_o$ is 1.0 mil, $r_l$ is 6 mil, then $d_o=6.5+(6-6)+1.0-2.0$ $d_o=5.5$ Thus the center of the reticule should be offset 5.5 mil from the center of the through hole at the last exposure. Preferably between the first exposure in which the reticule is positioned over the intended through hole position, and the exposure at which the reticule is positioned 5.5 mil from the center of the through hole, the reticule is positioned at halfway or 2.75 mil from the center of the through hole and exposed.

As used herein, "length" refers to the dimension of the non-annular land along the axis of the wire connected to the non-annular land, as measured from the edge of the through hole to the edge of the wire. The non-annular land length is preferably 0.1 to 2 times, more preferably 0.5 to 0.75 times the value of z minus (s+$t_o$). While the non-annular land length could exceed 2 times the value of z minus (s+$t_o$), this defeats the objective of providing increased real estate. Smaller lengths, that is smaller than 0.1 times the value of z minus (s+$t_o$) result in an increased rate of failure for connections, and are less preferred. Typically, when such lengths smaller than 0.1 times the value of z minus (s+$t_o$) are employed, there is not enough dielectric material between the non-annular land and the adjacent wire so that a short occurs between the non-annular land and the adjacent wire.

The width of the non-annular land is the dimension of the land along the direction perpendicular to the length of the land. The width of the non-annular land is greater than the width of the wire. While the width of the Non-annular land may exceed the width of the drilled through hole. Preferably, the width of the Non-annular land is less than or equal to the drilled through hole width.

The lands are made of the same material as the wires, which are typically copper.

Producing the non-annular land

Figure 4:
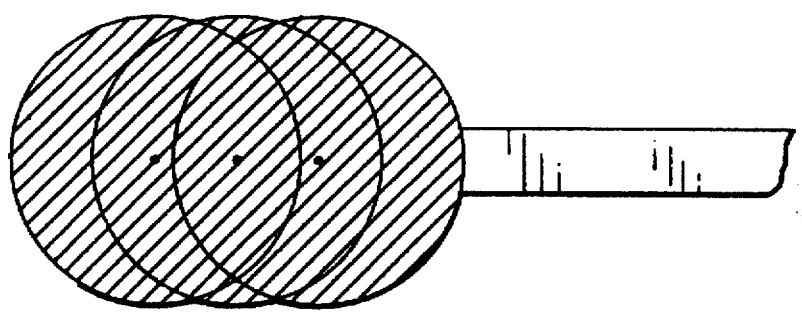
FIG. 4 is a plated through hole showing positioning of artwork in producing the non-annular land.

First the artwork is formed employing conventional photolithographic techniques. The image of the desired non-annular land is exposed on a photo-sensitive emulsion carrier on glass or other transparent substrate. The preferred method for forming the non-annular land is shown in FIG. 4. A conventional circular reticule is centered, at the position corresponding to (x, y), which is the center of where the through hole is to be drilled. The emulsion is exposed to light, preferably UV light. Then the reticule is offset from the through hole center by the offset distance $d_o$ calculated using the above Formulae. Thus, the reticule is centered at position corresponding to (x+$d_o$/2, y) and exposed. Preferably, to obtain an even longer Non-annular land, the reticule is positioned at position corresponding to (x+$d_o$, y) and exposed a second time. Thereafter the emulsion carrier is developed. Typically, the non-annular land need only be large enough to allow the actual through hole to be positioned at the minimum adjacent conductor spacing.

Alternatively, the custom artwork, that is, the exposure mask formed in the desired shape of the non-annular land may be used, rather than forming the artwork using a conventional circular reticule.

The artwork is then used in a traditional printed circuit photoimaging process, in which a photoimageable resist is applied to a substrate, and exposed to actinic radiation through the artwork. The photoresist is conventionally developed using conventional processes to form the desired pattern. Preferably subtractive processes are used in which the photoresist when developed, forms the final non-annular land shape. The unexposed photoresist is removed by conventional solvents, leaving the exposed photoresist in the desired pattern. An etchant is then used to remove metal not protected by exposed photoresist. The exposed photoresist is stripped leaving the final conductive pattern including the desired non-annular lands.

Alternatively, or additionally, conventional additive processes may be used. In such additive processes, the spaces between the photoresist, when developed, define the circuitization pattern. The circuitization is then formed in such spaces by conventional methods such as by additive plating. After the plating, the photoresist is stripped leaving the final conductive pattern including the desired non-annular lands.

Upon assembly of the "core" substrate into a composite structure, the cores are registered, that is aligned, to make the proper connection to the required layers. The assembly is then drilled to form the desired through holes and through holes are conventionally plated typically using electrolytic or electroless copper plating. Alternatively, the through holes may be filled with conductive paste. As a result, the plated through hole contacts the non-annular land as shown in FIG. 3.

EXAMPLE 1

Figure 5:
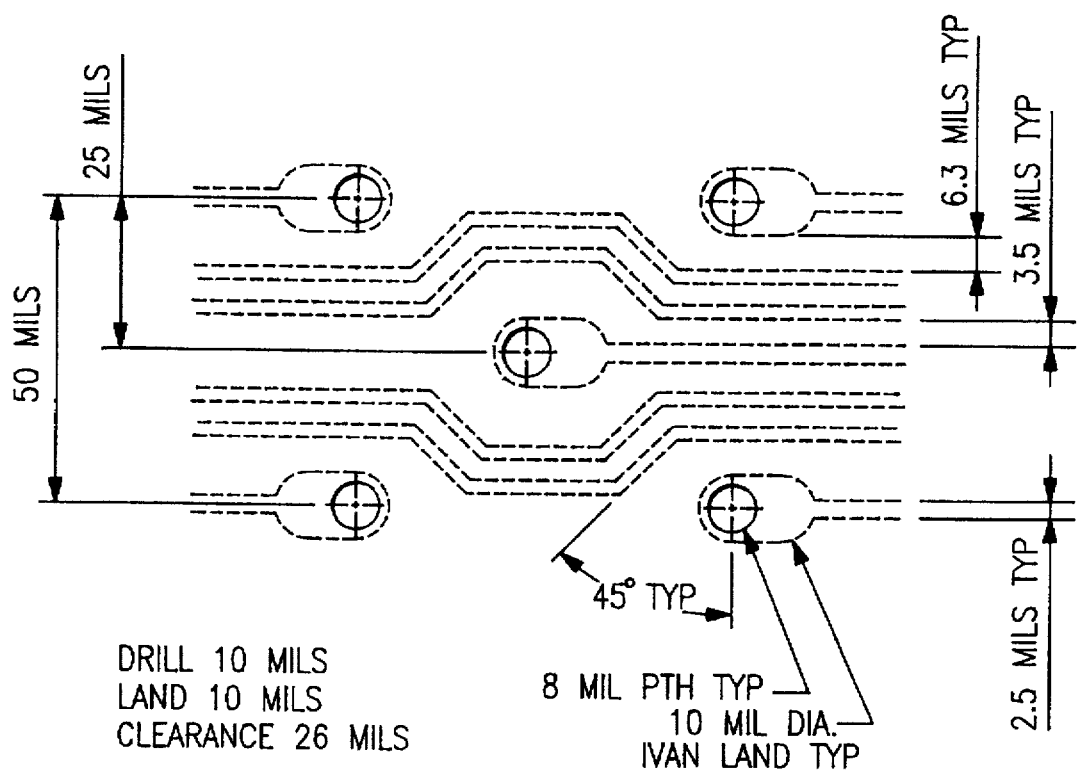
FIGS. 5, 6 and 7 show various wiring configurations with Non-annular lands of this invention.

A thin light card having an minimum spacing between lines of 2 mils and containing the non-annular land of the present invention was prepared as follows. A circular opaque reticule having a diameter of 0.011 inches was placed on a photosensitive emulsion which was deposited on a transparent substrate to create the artwork. The reticule was placed at centers of desired through holes and exposed to ultraviolet light. The reticules were offset by 3 mils from hole center, exposed, offset a second time by 3 mils and exposed. The reticules were removed and the emulsion developed to produce artwork. A conventional negative photoresist available under the name "Resiston" from DuPont Chemical Company was applied to 0.0014 inches layer of copper disposed on a card having grid dimensions of 0.050×0.025 inches. The photoresist was exposed to actinic radiation through the artwork and conventionally developed. The card was etched to define the Lands, then the photoresist was stripped. After completing several conventional fabrication steps including lamination, pinning and registration, the through holes were drilled using a 0.010 inch drill bit. The through holes were conventionally plated using electrolytic copper plating, to provide through holes having a diameter of 0.008 inches and a Land having a width of 0.010 inches and a length of 0.006 inches. The wiring pattern for a portion of the card is shown in FIG. 5.

EXAMPLE 2

Figure 6:
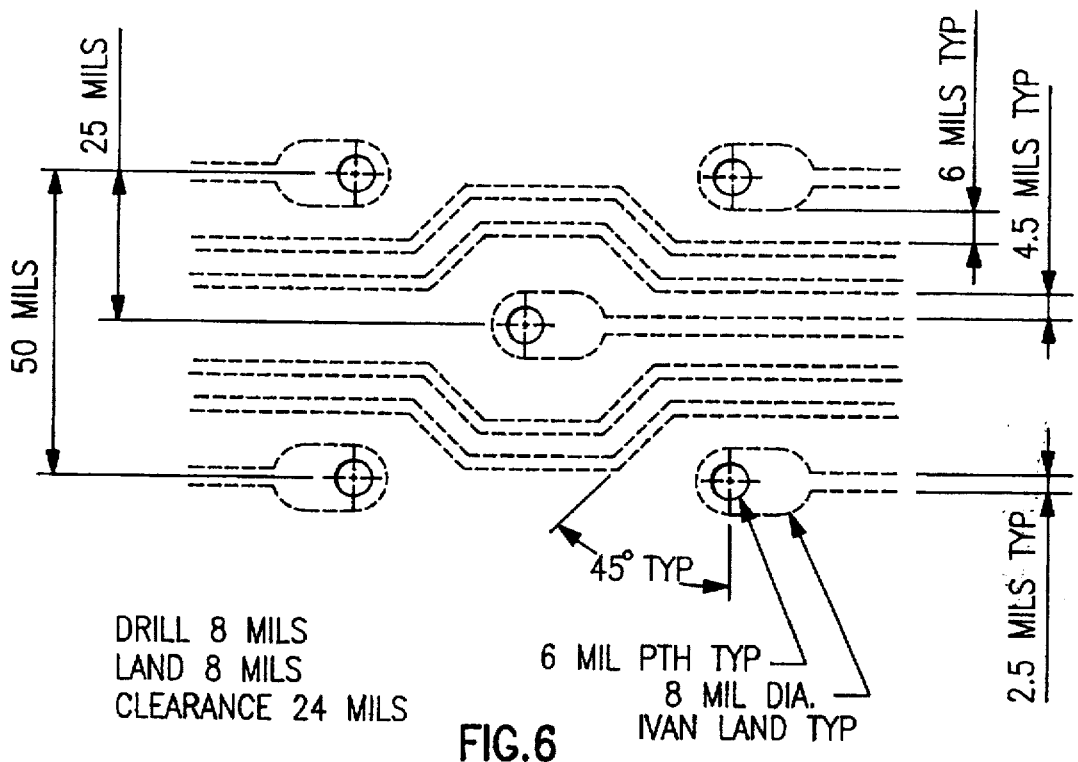

A card having an s value of 2 mils and containing the non-annular land of the present invention was prepared as follows. A circular opaque reticule having a diameter of 0.009 inches was placed on a photosensitive emulsion which was deposited on a transparent substrate to create artwork. The reticule was placed at centers of desired through holes and exposed to ultraviolet light. The reticules were offset by 3 mils from the through hole center, exposed, offset a second time by 3 mils and exposed. The reticules were removed and the emulsion developed to produce artwork. A conventional negative photoresist available under the name Resiston from Dupont was applied to 0.0014 inch layer of copper disposed on a card having grid dimensions of 0.050×0.025 inches. The photoresist was exposed to actinic radiation through the artwork, and conventionally developed. The card was etched to define the Lands, then the photoresist was stripped. Next, the through holes were drilled using a 0.008 inch drill bit. The through holes were conventionally plated using electrolytic copper plating, to provide through holes having a diameter of 0.006 inches and a Land having an width of 0.008 inches and an length of 0.006 inches. The wiring pattern is shown in FIG. 6.

EXAMPLE 3

Figure 7:
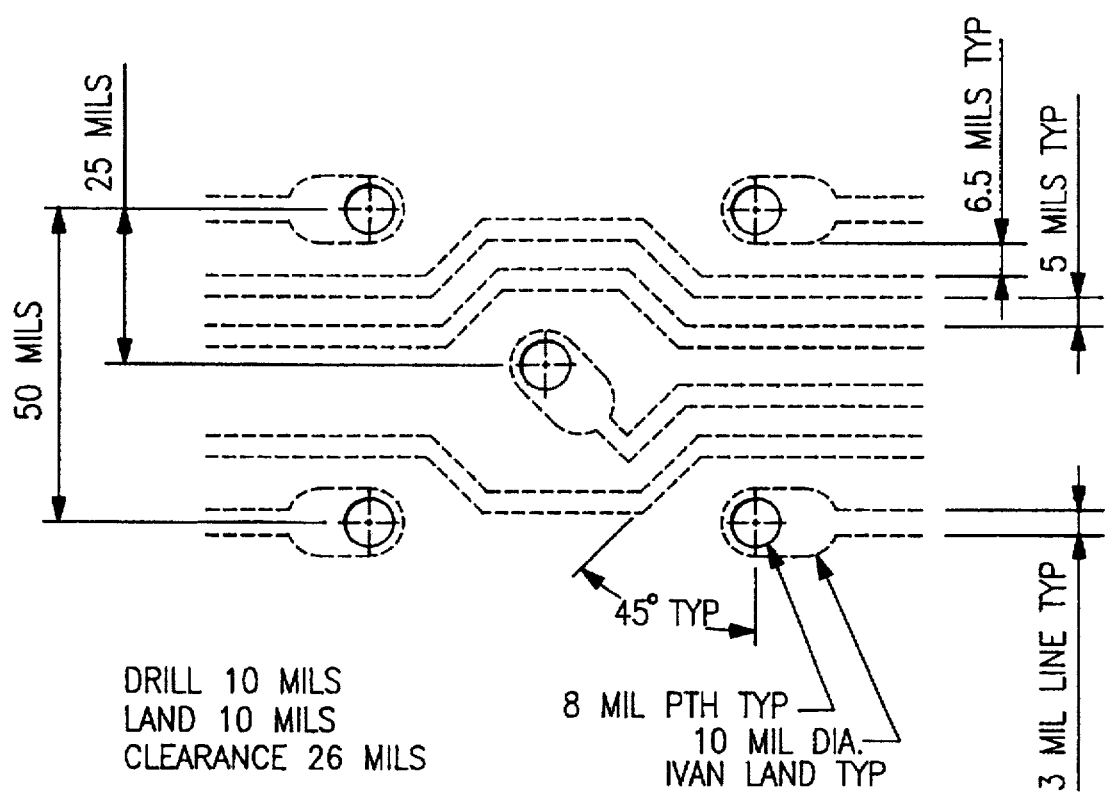

A card containing an non-annular land of the present invention was prepared as follows. A circular opaque reticule having a diameter of 0.011 inches was placed on a photosensitive emulsion which was deposited on a transparent substrate to create artwork. The reticule was placed at centers of desired through holes and exposed to ultraviolet light. The reticules were offset by 3 mils from the through hole center, exposed and offset a second time by 3 mils and exposed. The reticules were removed and the emulsion developed to produce artwork. A conventional negative photoresist available under the name "Resiston" from Dupont Chemical Company, was applied to 0.0014 inch layer of copper disposed on card having grid dimensions of 0.050×0.025 inches. The photoresist was exposed to actinic radiation through the artwork, and conventionally developed. The card was etched to define the Lands, then the photoresist was stripped. Next, the holes were drilled using a 0.010 inch drill bit. The through holes were conventionally plated using electrolytic copper plating, to provide through holes having a diameter of 0.008 inches and a Land having a width of 0.010 inches and a length of 0.006 inches. The wiring diagram is shown in FIG. 7.

Evaluation of the non-annular lands

As shown in FIG. 1, by using the non-annular lands the real estate is increased between through holes that are spaced 50 mils apart. As a result, this permits room for a third wire having a width of 0.004 inches to be added in addition to the other two wires thereby increasing the wireability density by 50%. In turn, this increased wiring capability on one surface, permits the number of wiring planes required, to be reduced in certain applications.

The reliability of the wire connections was determined by subjecting the cards to a simulated card assembly process. The cards were subjected to accelerated thermal cycling and insulation resistance tests to simulate the power on hours and thermal cycles associated with the on off cycling. There were no failures of the Non-annular lands.

Although certain embodiment of this invention have been shown and described, various adaptations and modifications can be made without departing from the scope of the invention as defined in the appended claims.

What is claimed is:

1. A method for forming a non-annular Land in a circuit board:

a. providing a substrate having wires disposed thereon;

b. providing positions for through holes in the substrate;

c. forming metal on the substrate over the positions for the through holes said metal also connected to a wire;

d. drilling through the metal at the desired through hole locations to provide through holes, and to form the non-annular lands in the remaining metal said metal being in contact with the through holes; and e. disposing conductive material in said through holes to electrically connect the through hole to the non-annular land, to provide non-annular Lands which partially surround said through holes and which electrically connect the wire to the conductive material in the through hole.

2. The method of claim 1 wherein the conductive material comprises plated metal.

3. The method of claim 1 wherein the conductive material comprises electrically conductive paste.

4. The method of claim 1, wherein the land has a length from 0.1 to 2 times $(z+t_o-s)$, wherein z is the minimum distance between the edge of the through hole and the nearest adjacent wire and s is the minimum desired spacing of the conductor lines, and $t_o$ is the tolerance of the etch process or 0.

5. The method of claim 1, wherein the width of the wire is less than the width of the through hole and the width of the land ranges from greater than the wire width to less than or equal to the through hole width.

6. The method of claim 4, wherein the width of the wire is less than the width of the through hole and the width of the land ranges from greater than the wire width to less than or equal to the through hole width.

7. A method for forming a non-annular Land in a circuit board:

a. providing a substrate having wires disposed thereon;

b. providing positions for through holes in the substrate;

c. forming metal on the substrate over the positions for the through holes said metal also connected to a wire;

d. drilling through the metal at the desired through hole locations to provide through holes, and to form the non-annular lands in the remaining metal said metal being in contact with the through holes; and e. disposing conductive material in said through holes to electrically connect the through hole to the non-annular land, to provide non-annular Lands which partially surround said through holes and which electrically connect the wire to the conductive material in the through hole, wherein the metal is formed in step c by photolithographic process employing artwork formed by employing a reticule and the length of the land is determined by determining the offset distance of the reticule according to the following formula $d_o=z+(r_h-r_f)+t_o-s$, wherein z is the minimum desired space between the edge of the through hole and the nearest adjacent wire, $t_o$ is the tolerance of the etch process or 0, $r_h$ is the radius of the through hole, $r_f$ is the radius of the reticule used to form the artwork used to form the Non-annular land, and $d_o$ is the offset distance of the reticule.

* * * * *